(12) United States Patent
Shibata

(10) Patent No.: US 7,737,012 B2
(45) Date of Patent: Jun. 15, 2010

(54) MANUFACTURING METHOD OF A SEMICONDUCTOR DEVICE

(75) Inventor: Satoshi Shibata, Toyama (JP)

(73) Assignee: Panasonic Corporation, Osaka (JP)

( * ) Notice: Subject to any disclaimer, the term of this patent is extended or adjusted under 35 U.S.C. 154(b) by 127 days.

(21) Appl. No.: 10/557,746

(22) PCT Filed: Mar. 29, 2005

(86) PCT No.: PCT/JP2005/005947

§ 371 (c)(1),
(2), (4) Date: Nov. 21, 2005

(87) PCT Pub. No.: WO2005/096357

PCT Pub. Date: Oct. 13, 2005

(65) Prior Publication Data

US 2007/0054444 A1    Mar. 8, 2007

(30) Foreign Application Priority Data

Mar. 31, 2004    (JP)    ............... 2004-103681

(51) Int. Cl.
*H01L 21/265*    (2006.01)
(52) U.S. Cl. ............... 438/522; 438/549; 257/E21.324; 257/E21.336
(58) Field of Classification Search ............. 438/197, 438/585, 528, 166, 301–308, 161–163, 519, 438/522; 257/344, E21.324, 794, 790, E21.618, 257/E21.633, E21.336
See application file for complete search history.

(56) References Cited

U.S. PATENT DOCUMENTS

| | | | | |
|---|---|---|---|---|
| 5,602,045 A | * | 2/1997 | Kimura | ............... 438/305 |
| 6,074,937 A | * | 6/2000 | Pramanick et al. | ........... 438/528 |
| 6,180,476 B1 | * | 1/2001 | Yu | ............................... 438/305 |
| 6,187,643 B1 | * | 2/2001 | Borland | ....................... 438/302 |
| 6,251,757 B1 | | 6/2001 | Yu | |
| 6,287,925 B1 | | 9/2001 | Yu | |

(Continued)

FOREIGN PATENT DOCUMENTS

JP    04-058524    2/1992

(Continued)

OTHER PUBLICATIONS

European Search Report issued in European Patent Application No. EP 05727888.9-2203/1732112 PCT/JP2005005947, dated Sep. 3, 2008.

*Primary Examiner*—W. David Coleman
*Assistant Examiner*—Latanya Crawford
(74) *Attorney, Agent, or Firm*—McDermott Will & Emery LLP

(57) ABSTRACT

An amorphous layer 101 is formed in a region from a surface of a silicon substrate 100 to a first depth A. At this time, defects 103 are generated near an amorphous-crystal interface 102. By heat treatment, the crystal structure of the amorphous layer 101 is restored in a region from the first depth A to a second depth B that is shallower than the first depth A. The resultant amorphous layer 101 extends from the surface of the silicon substrate 100 to the second depth B. The defects 103 remain at the first depth A. By ion implantation, a pn junction 104 is formed at a third depth C that is shallower than the second depth B.

20 Claims, 8 Drawing Sheets

U.S. PATENT DOCUMENTS

| | | | | |
|---|---|---|---|---|
| 6,362,063 B1 * | 3/2002 | Maszara et al. | | 438/307 |
| 6,391,751 B1 * | 5/2002 | Wu et al. | | 438/585 |
| 6,472,282 B1 * | 10/2002 | Yu | | 438/305 |
| 6,521,502 B1 * | 2/2003 | Yu | | 438/305 |
| 6,548,361 B1 * | 4/2003 | En et al. | | 438/301 |
| 6,555,439 B1 * | 4/2003 | Xiang et al. | | 438/305 |
| 6,624,037 B2 * | 9/2003 | Buynoski et al. | | 438/305 |
| 6,642,122 B1 * | 11/2003 | Yu | | 438/372 |
| 6,680,250 B1 * | 1/2004 | Paton et al. | | 438/660 |
| 6,699,771 B1 * | 3/2004 | Robertson | | 438/420 |
| 6,893,930 B1 * | 5/2005 | Yu et al. | | 438/305 |
| 7,091,097 B1 * | 8/2006 | Paton et al. | | 438/303 |
| 7,094,671 B2 * | 8/2006 | Li | | 438/520 |
| 7,247,547 B2 * | 7/2007 | Zhu et al. | | 438/486 |
| 2002/0068407 A1 * | 6/2002 | Ono | | 438/279 |
| 2002/0121654 A1 * | 9/2002 | Yamamoto | | 257/288 |
| 2004/0072394 A1 * | 4/2004 | Noda | | 438/163 |
| 2004/0235280 A1 * | 11/2004 | Keys et al. | | 438/528 |
| 2005/0003638 A1 * | 1/2005 | Stolk | | 438/482 |
| 2005/0136623 A1 * | 6/2005 | Tan et al. | | 438/471 |

FOREIGN PATENT DOCUMENTS

| | | |
|---|---|---|
| JP | 05-190850 | 7/1993 |
| JP | 06-089869 | 3/1994 |
| JP | 08-203842 | 8/1996 |

* cited by examiner

MANUFACTURING METHOD OF A SEMICONDUCTOR DEVICE

This application is the U.S. National Phase under 35 U.S.C. §371 of International Application No. PCT/JP2005/005947, filed Mar. 29, 2005, which in turn claims the benefit of Japanese Application No. 2004-103681, filed Mar. 31, 2004, the disclosures of which Applications are incorporated by reference herein in their entirety.

TECHNICAL FIELD

The invention generally relates to a method for manufacturing a semiconductor device. More particularly, the invention relates to a method for forming a shallow junction with a suppressed leakage current.

BACKGROUND ART

With recent improvement in integration, performance, and operation speed of semiconductor integrated circuit devices, a short-channel effect of transistors has become an increasingly serious problem. One of the known technologies for reducing the short-channel effect is to use a drain extension having an extremely shallow pn junction.

For example, it is said that, for a transistor having a gate electrode dimension of 65 nm, a desirable pn junction depth of a drain extension is about 13 nm. Possible technologies for implementing such a pn junction depth are a flash lamp annealing technology and a laser annealing technology in both of which the thermal budget time is suppressed to several milliseconds.

However, the heat treatment time is extremely short in such short-time heat treatment technologies. Therefore, the impurity activation ratio varies depending on a pattern on semiconductor devices, and transistor characteristics vary as a result. Such variation in transistor characteristics can be a critical drawback for mass production of system LSIs having various patterns.

In view of this problem, a technology has been proposed in which heat treatment is conducted for several minutes at a temperature that causes only activation of impurities without diffusion thereof, for example, in a temperature range from 500° C. to 800° C. This technology is called a low temperature SPE (Solid Phase Epitaxy) technology.

Hereinafter, formation of a P-channel transistor by a conventional low temperature SPE technology will be described with reference to the accompanying drawings.

FIGS. 6(*a*) through 6(*c*) and FIGS. 7(*a*) and 7(*b*) are schematic cross-sectional views showing the process of forming a P-channel transistor by using the low temperature SPE technology.

As shown in FIG. 6(*a*), a gate electrode 12 is first formed on a silicon substrate 10 with a gate insulating film 11 interposed therebetween. An amorphous layer 13 is then formed by implanting germanium or silicon ions on both sides of the gate electrode 12 in the silicon substrate 10 at implantation energy in the range of several keV to several tens of keV. At this time, defects 14 are generated near the interface between the amorphous layer 13 and the silicon substrate 10 that is located under the amorphous layer 13 and that has a crystal structure.

As shown in FIG. 6(*b*), a drain extension 15 is then formed by implanting boron ions into the amorphous layer 13 as a dopant at implantation energy of 1 keV or less.

As shown in FIG. 6(*c*), a halo region 16 is formed by implanting arsenic or antimony ions on both sides of the gate electrode 12 in the silicon substrate 10 at a tilt angle of, e.g., 25 degrees with respect to the normal to the substrate surface.

As shown in FIG. 7(*a*), a sidewall 17 is then formed on both sides of the gate electrode 12. A contact drain 18 is formed by implanting boron ions on both sides of the gate electrode 12 and the sidewall 17 in the silicon substrate 10 at implantation energy of several keV.

Finally, as shown in FIG. 7(*b*), heat treatment is conducted for several minutes at a temperature of 500° C. to 800° C. As a result, the crystal structure of the amorphous layer 13 is restored, and there is no longer an amorphous region in the silicon substrate 10. However, the defects 14 remain in the region that used to be the interface between the amorphous layer 13 and the silicon substrate 10.

In the above process, boron ions implanted as a dopant to form the drain extension 15 are rapidly activated in the amorphous layer 13 without diffusion during restoration of the crystal structure of the amorphous layer 13. As a result, a shallow pn junction is formed. The depth of a pn junction that is formed by this technology is substantially determined by an impurity profile that is formed right after ion implantation.

The amorphous layer 13 extends down to a level that is deeper than the pn junction of the drain extension 15. In order to form such an amorphous layer 13, the implantation energy for implanting germanium or silicon ions into the silicon substrate 10 to form the amorphous layer 13 is determined so that the entire profile of boron that is implanted to form the drain extension 15 is contained in the amorphous layer 13.

The drain extension 15 having a pn junction depth of less than 20 nm is thus formed. Since the heat treatment time is as long as several minutes, the resultant drain extension 15 has extremely low pattern dependency. The pattern dependency means that factors such as an impurity activation ratio vary depending on a pattern that is formed on the wafer surface (in a single chip). For example, when a polysilicon gate electrode is not uniformly distributed in the whole wafer, the impurity activation ratio varies due to the density difference of the distribution.

Non-patent reference 1: John O. Borland, Low Temperature Activation of Ion Implanted Dopants, Extended Abstracts of International Workshop on Junction Technology 2002, Japan Society of Applied Physics, December 2002, pp. 85-88.

DISCLOSURE OF THE INVENTION

Problems to be Solved by the Invention

However, the above low temperature SPE technology has the following problems: the amorphous layer has a depth of about 15 nm to about 30 nm. Therefore, defects that are generated at the interface between the amorphous layer and the crystal (silicon substrate) layer when ions are introduced are located very close to the pn junction of the halo region and the pn junction of the drain extension. As a result, conventional semiconductor integrated circuit devices that are produced by using the low temperature SPE technology have a significantly increased junction leakage current as compared to that of semiconductor integrated circuit devices that are produced by using flash lamp annealing or laser annealing.

In view of the above problems, it is an object of the invention to provide a method for manufacturing a semiconductor device with a suppressed junction leakage current and suppressed pattern dependency by using a low temperature SPE technology.

Means for Solving the Problems

In order to achieve the above object, the inventor arrived at a method for suppressing a junction leakage current. In this method, the position of defects that are generated near the interface between an amorphous layer and a crystal region during formation of the amorphous layer is adjusted according to the depth of each pn junction of a semiconductor device. The defects that are generated at the amorphous-crystal interface are thus separated from each pn junction that is required for elements such as a transistor, and a junction leakage current is suppressed.

More specifically, a method for manufacturing a semiconductor device according to a first aspect of the invention includes the steps of: forming an amorphous layer in a region from a surface of a semiconductor region to a first depth; by heat treating the amorphous layer at a prescribed temperature, restoring a crystal structure of the amorphous layer in a region from the first depth to a second depth that is shallower than the first depth so that the amorphous layer shrinks to the second depth; and forming a pn junction at a third depth that is shallower than the second depth by introducing ions into the heat-treated amorphous layer.

In the manufacturing method of a semiconductor device according to the first aspect, the thickness of the amorphous layer that is formed by introducing ions and the position of the defects that are generated during formation of the amorphous layer can be individually determined so that the amorphous layer is separated from the defects. This will now be described in more detail.

When an amorphous layer is formed in a semiconductor region, crystal defects are generated near the interface between the amorphous layer and a portion of the semiconductor region which has a crystal structure (hereinafter, this interface is referred to as an amorphous-crystal interface). In the manufacturing method of a semiconductor device according to the first aspect, the amorphous layer is formed in the region from the surface of the semiconductor region to the first depth. Therefore, the amorphous-crystal interface is present at the first depth and the defects are also present near the first depth. By heat treating the amorphous layer, the crystal structure of the amorphous layer is restored in the region from the first depth to the second depth that is shallower than the first depth. The resultant amorphous layer extends from the surface of the semiconductor region down to the second depth. Therefore, after the heat treatment, the amorphous-crystal interface is present at the second depth. The thickness of the amorphous layer (the second depth at which the amorphous-crystal interface is present) and the position where the defects are present (the first depth) can thus be individually determined so that the amorphous layer is separated from the defects. A pn junction is then formed at the third depth that is shallower than the second depth by introducing ions into the amorphous layer. In this way, the crystal defects that are generated near the first depth during formation of the amorphous layer can be sufficiently separated from the pn junction that is formed at the third depth.

The manufacturing method of a semiconductor device according to the first aspect thus enables reduction in a junction leakage current. A junction leakage current is caused when a pn junction is close to defects. In the manufacturing method of a semiconductor device according to the first aspect, however, the pn junction can be sufficiently separated from the defects, enabling reduction in a junction leakage current.

By heat treating the amorphous layer for a relatively long time, that is, for several minutes, activation can be conducted without pattern dependency. As a result, a semiconductor device having a shallow pn junction (e.g., a drain extension junction) and a reduced junction leakage current can be manufactured without pattern dependency.

In the manufacturing method of a semiconductor device according to the first aspect, the prescribed temperature of the heat treatment is preferably in a range of 475° C. to 600° C.

By conducting the heat treatment in this temperature range for a relatively long time, that is, for several minutes, activation can be reliably conducted without pattern dependency. As a result, a semiconductor device having a shallow pn junction (e.g., a drain extension junction) and a reduced junction leakage current can be manufactured without pattern dependency.

A method for manufacturing a semiconductor device according to a second aspect of the invention includes the steps of: forming an amorphous layer in a region from a surface of a semiconductor region of a first conductivity type to a first depth; by heat treating the amorphous layer at a prescribed temperature, restoring a crystal structure of the amorphous layer in a region from the first depth to a second depth that is shallower than the first depth so that the amorphous layer shrinks to the second depth; forming a first impurity layer of a second conductivity type which has a pn junction at a third depth that is shallower than the second depth by introducing ions into the heat-treated amorphous layer; and activating the first impurity layer.

In the manufacturing method of a semiconductor device according to the second aspect, a semiconductor device having an impurity region with a shallow pn junction can be manufactured with a reduced junction leakage current as in the manufacturing method of a semiconductor device according to the first aspect. Moreover, by conducting both the heat treatment of the amorphous layer and heat treatment for the activation of the first impurity layer for a relatively long time, that is, for several minutes, generation of pattern dependency can be prevented in the step of restoring the crystal structure of the amorphous layer and in the step of activating the impurity layer.

A method for manufacturing a semiconductor device according to a third aspect of the invention includes the steps of: forming a gate electrode on a semiconductor region of a first conductivity type; forming an amorphous layer in a region from a surface of the semiconductor region of the first conductivity type to a first depth; by heat treating the amorphous layer at a prescribed temperature, restoring a crystal structure of the amorphous layer in a region from the first depth to a second depth that is shallower than the first depth so that the amorphous layer shrinks to the second depth; forming a first impurity layer of a second conductivity type which has a pn junction at a third depth that is shallower than the second depth by introducing ions into the heat-treated amorphous layer; forming a second impurity layer of a first conductivity type which has a pn junction at a level that is shallower than the first depth and deeper than the third depth by introducing ions into the heat-treated amorphous layer; and activating the first impurity layer and the second impurity layer.

In the manufacturing method of a semiconductor device according to the third aspect, a MOSFET (Metal Oxide Semiconductor Field Effect Transistor) and the like having an impurity layer with a shallow pn junction can be manufactured with a reduced junction leakage current as in the manufacturing method of a semiconductor device according to the first aspect. Moreover, by conducting both the heat treatment of the amorphous layer and heat treatment for the activation of the first impurity layer for a relatively long time, that is, for several minutes, generation of pattern dependency can be prevented in the step of restoring the crystal structure of the amorphous layer and in the step of activating the impurity layers.

Since the second impurity layer is formed, the effect of the invention, that is, a reduced leakage current, can be realized when a semiconductor device having, e.g., a halo region as a second impurity layer is manufactured.

In the manufacturing method of a semiconductor device according to the first, second or third aspect of the invention, the third depth is preferably in a range of 5 nm to 15 nm.

When the first impurity layer is formed at the third depth of the above range, a junction leakage current and pattern dependency can be reduced. Moreover, the first impurity layer can be used as, e.g., a drain extension having a shallow pn junction, which is advantageous for reduction in a short-channel effect.

In the manufacturing method of a semiconductor device according to the second or third aspect of the invention, the prescribed temperature of the heat treatment is preferably in a range of 475° C. to 600° C., and the activation of the first impurity layer or the activation of the first impurity layer and the second impurity layer is preferably conducted in a temperature range of 500° C. to 700° C.

By conducting the heat treatment in this temperature range for a relatively long time, that is, for several minutes, generation of pattern dependency can be prevented during restoration of the crystal structure of the amorphous layer. Moreover, by using a low temperature SPE technology in the activation of the impurity layer(s), the impurity layer(s) can be activated while suppressing generation of pattern dependency and impurity diffusion.

A pattern of a gate electrode that is formed on the semiconductor region may be non-uniformly distributed on the semiconductor region.

The phrase "a pattern of a gate electrode that is formed on the semiconductor region is non-uniformly distributed" means, for example, that the gate electrode is densely formed on one part of the semiconductor region and dispersedly formed on another part of the semiconductor region.

In such a case, the effect of the invention is remarkably obtained by conducting heat treatment at a low temperature for several minutes. In other words, a semiconductor device with characteristics having no pattern dependency can be manufactured by conducting such heat treatment. This means that the effect of a low temperature SPE technology is remarkably obtained. The effect of the invention is remarkably obtained even when a pattern other than the gate electrode is non-uniformly distributed.

A method for manufacturing a semiconductor device according to a fourth aspect of the invention includes the steps of: forming a gate electrode on a semiconductor region of a first conductivity type; forming an amorphous layer in a region from a surface of the semiconductor region to a first depth; forming an insulating sidewall on a side surface of the gate electrode while restoring a crystal structure of the amorphous layer in a region from the first depth to a second depth that is shallower than the first depth so that the amorphous layer shrinks to the second depth, the restoration of the crystal structure of the amorphous layer being caused by heat treatment of a prescribed temperature which is conducted during formation of the sidewall; forming a first impurity layer of a second conductivity type which has a pn junction at a third depth that is shallower than the second depth by introducing ions on both sides of the gate electrode in the heat-treated amorphous layer; and activating the first impurity layer.

In the manufacturing method of a semiconductor device according to the fourth aspect, a MOSFET and the like having an impurity layer with a shallow pn junction can be manufactured with a reduced junction leakage current as in the manufacturing method of a semiconductor device according to the first aspect. Moreover, by conducting both the heat treatment of the amorphous layer and heat treatment for the activation of the first impurity layer for a relatively long time, that is, for several minutes, generation of pattern dependency can be prevented in the step of restoring the crystal structure of the amorphous layer and in the step of activating the impurity layer.

Moreover, by forming the sidewall and restoring the crystal structure of the amorphous layer in the region from the first depth to the second depth in the same step, the manufacturing process of a semiconductor device can be simplified.

Preferably, the manufacturing method of a semiconductor device according to the fourth aspect further includes the step of: after the step of forming the first impurity layer, forming a second impurity layer of a first conductivity type which has a pn junction at a level that is shallower than the first depth and deeper than the third depth by introducing ions on both sides of the gate electrode in the amorphous layer. Preferably, the second impurity layer is simultaneously activated in the step of activating the first impurity layer.

In this case, the effect of the invention, that is, a reduced leakage current, can be realized when a semiconductor device having, e.g., a halo region as a second impurity layer is manufactured.

In the manufacturing method of a semiconductor device according to the fourth aspect of the invention, the third depth is preferably in a range of 5 nm to 15 nm.

When the first impurity layer is formed with the third depth of the above range, a junction leakage current and pattern dependency can be reduced. Moreover, the first impurity layer can be used as, e.g., a drain extension having a shallow pn junction, which is advantageous for reduction in a short-channel effect.

In the manufacturing method of a semiconductor device according to the fourth aspect of the invention, the prescribed temperature of the heat treatment is preferably in a range of 475° C. to 600° C., and the activation of the first impurity layer or the activation of the first and second impurity layers is preferably conducted in a temperature range of 500° C. to 700° C.

By conducting the heat treatment in this temperature range for a relatively long time, that is, for several minutes, generation of pattern dependency can be prevented during restoration of the crystal structure of the amorphous layer. Moreover, by using a low temperature SPE technology in the activation of the impurity layer(s), the first impurity layer or the first and second impurity layers can be activated while suppressing generation of pattern dependency and impurity diffusion.

A pattern of a gate electrode that is formed on the semiconductor region may be non-uniformly distributed on the semiconductor region.

In such a case, the effect of the invention is remarkably obtained by conducting heat treatment at a low temperature for several minutes. In other words, a semiconductor device with characteristics having no pattern dependency can be manufactured by conducting such heat treatment. This means that the effect of a low temperature SPE technology is remarkably obtained. The effect of the invention is remarkably obtained even when a pattern other than the gate electrode is non-uniformly distributed.

Effects of the Invention

In a method for manufacturing a semiconductor device according to the invention, the thickness of an amorphous layer is changed after the amorphous layer is formed. Therefore, the position of defects that are generated during formation of the amorphous layer and the position of the interface between the amorphous layer and a crystal region of a semiconductor region (that is, the amorphous-crystal interface) can be individually arbitrarily determined so that the defects can be sufficiently separated from the amorphous layer.

Therefore, by forming a pn junction in the amorphous layer, the defects can be sufficiently separated from the pn junction. As a result, a shallow drain extension junction and the like can be formed while suppressing a junction leakage current resulting from the defects. Moreover, generation of pattern dependency can be prevented by using a low temperature SPE technology.

BRIEF DESCRIPTION OF THE DRAWINGS

[FIG. 1]

[FIG. 2]

[FIG. 3]

[FIG. 4]

[FIG. 5]

[FIG. 6]

[FIG. 7]

Figure 1A:
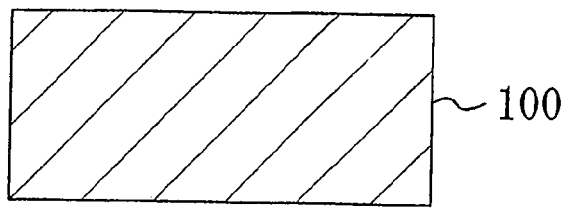
FIGS. 1(a) through 1(d) are schematic cross sectional views showing the steps of a method for manufacturing a semiconductor device according to a first embodiment of the invention.

DESCRIPTION OF THE REFERENCE NUMERALS 100 silicon substrate
101 amorphous layer
102 amorphous-crystal interface
103 defect
104 pn junction
106 gate insulating film
107 gate electrode
108 drain extension
109 halo region
110 sidewall
111 contact drain
A first depth
B second depth
C third depth

BEST MODE FOR CARRYING OUT THE INVENTION

First Embodiment

Hereinafter, a method for manufacturing a semiconductor device according to a first embodiment of the invention will be described with reference to the accompanying drawings.

FIGS. 1(a) through 1(d) are schematic cross-sectional views showing the steps of the method for manufacturing a semiconductor device according to the first embodiment.

As shown in FIG. 1(a), an n-type silicon substrate 100 is first prepared as an example of a semiconductor region.

Figure 1B:
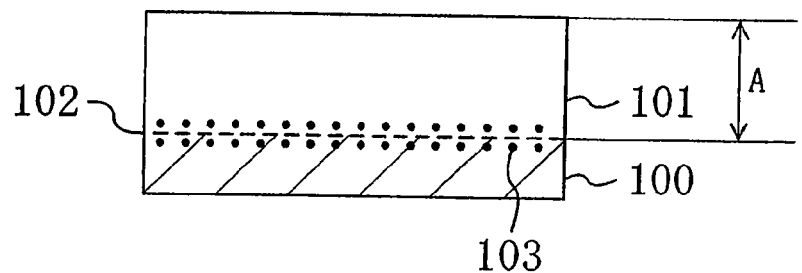

As shown in FIG. 1(b), ions such as germanium or silicon are implanted into the silicon substrate 100 in order to form an amorphous layer 101 in the region from the surface of the silicon substrate 100 to a first depth A. At this time, defects 103 are generated near the interface between the silicon substrate 100 and a crystal region of the amorphous layer 101 (hereinafter, this interface is referred to as an amorphous-crystal interface 102), that is, near the first depth A. The first depth A for the amorphous layer 101 can be arbitrarily determined by adjusting the implantation energy of the ion implantation process. As a result, the depth at which the defects 103 are present can be arbitrarily determined.

Figure 1C:
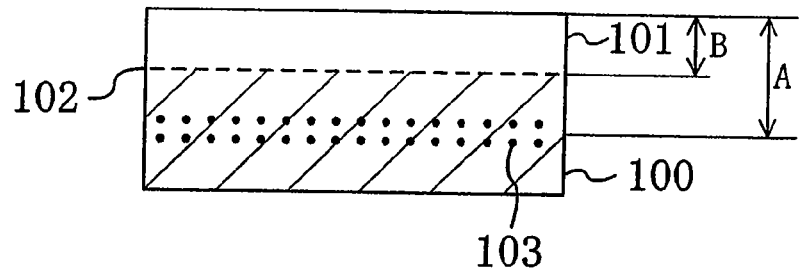

The silicon substrate 100 is then heat treated at a low temperature (e.g., 500° C.). As a result, the crystal structure of the amorphous layer 101 is restored from the amorphous-crystal interface 102 toward the surface of the silicon substrate 100 at a prescribed restoration rate. As shown in FIG. 1(c), by adjusting the temperature and the treatment time of the heat treatment process, the crystal structure can be restored to an arbitrary second depth B that is shallower than the first depth A so that the amorphous layer 101 can shrink into the region from the surface of the silicon substrate 100 to the second depth B. In other words, the thickness of the amorphous layer 101 is reduced to the thickness from the surface of the silicon substrate 100 to the second depth B.

As a result, the defects 103 that are present at the first depth A corresponding to the pre-heat-treatment amorphous-crystal interface 102 can be sufficiently separated from the post-heat-treatment amorphous-crystal interface 102 located at the second depth B.

Figure 1D:
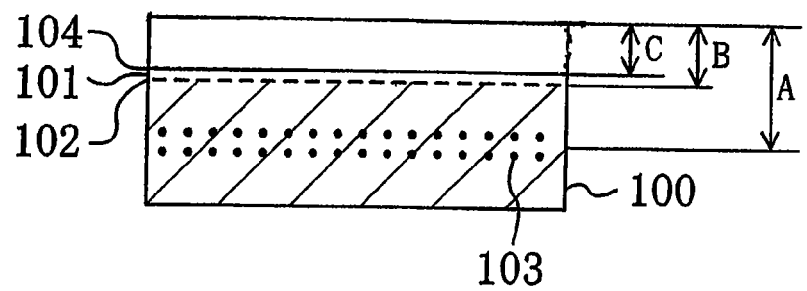

As shown in FIG. 1(d), impurity ions are then implanted into the amorphous layer 101 in order to form a pn junction 104 at a third depth C that is shallower than the second depth B. In other words, the pn junction 104 is formed within the amorphous layer 101.

According to the first embodiment, the position of the amorphous-crystal interface and the position of the defects can be controlled to be separated from each other. Since each junction that is required for transistor formation of a semiconductor device is formed by ion implantation into the amorphous layer, the position of each junction can be selected from a wider range. In other words, each junction can be prevented from being formed near defects that are present at the amorphous-crystal interface that is formed when the amorphous layer is initially formed, and the position of each junction can be arbitrarily selected.

More specifically, the depth of the amorphous layer 101 (the first depth A) can be arbitrarily controlled by adjusting the conditions of the ion implantation. Therefore, the depth at which the defects 103 are generated can be arbitrarily controlled. By adjusting the conditions of the heat treatment to the amorphous layer 101, the depth of the amorphous layer 101 after the heat treatment (the second depth B that is shallower than the first depth A) can be arbitrarily controlled. Moreover, by conducting ion implantation to the amorphous layer 101 after the heat treatment, the pn junction 104 is formed within the amorphous layer 101 at the third depth C that is shallower than the second depth B. Since the second depth B is shallower than the first depth A, the pn junction 104 (the third depth C) is located away from the defects 103 that are present at the first depth A.

A junction leakage current can be reduced in this way. A junction leakage current is caused when the pn junction 104 is close to the defects 103. In the present embodiment, however, the pn junction 104 can be sufficiently separated from the defects 103, enabling reduction in a junction leakage current.

The temperature of the heat treatment (low temperature annealing) for restoring the depth of the amorphous layer 101 is preferably in the range of 475° C. to 600° C. The temperature of the heat treatment is 500° C. in the present embodiment. The amorphous-crystal interface 102 has roughness (unevenness) right after the amorphous layer 101 is formed. However, such roughness can be substantially eliminated by conducting annealing at such a temperature. More specifically, the roughness of the amorphous-crystal interface 102 can be reduced to 1 nm or less.

In the present embodiment, an n-type silicon substrate 100 is used as a semiconductor region. However, a p-type silicon substrate may alternatively be used.

In the present embodiment, ions are introduced into the amorphous layer by ion implantation. However, ions may alternatively be introduced by other means such as plasma doping.

Second Embodiment

Hereinafter, a method for manufacturing a semiconductor device according to a second embodiment of the invention will be described with reference to the accompanying drawings.

FIGS. 2(a) through 2(c) and FIGS. 3(a) through 3(c) are schematic cross-sectional views showing the steps of the method for manufacturing a semiconductor device according to the second embodiment.

Figure 2A:
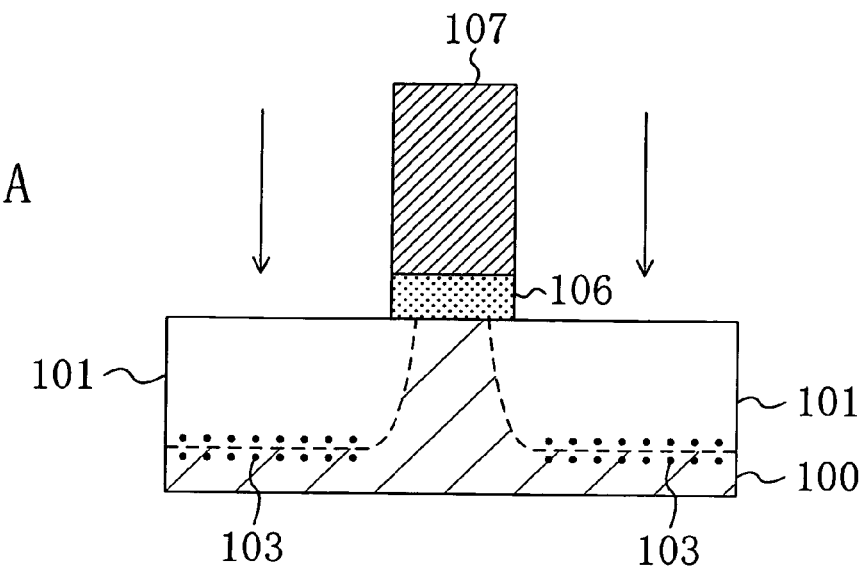
FIGS. 2(a) through 2(c) are schematic cross sectional views showing the steps from gate electrode formation to amorphous layer formation in a method for manufacturing a semiconductor device according to a second embodiment of the invention.

As shown in FIG. 2(a), a polysilicon gate electrode 107 is formed on an n-type silicon substrate 100 as a semiconductor region with a gate insulating film 106 interposed therebetween. For example, the gate electrode 107 may be formed by using a known lithography technology and a known etching technology. For example, the gate length is 70 nm.

Ions such as germanium or silicon are implanted on both sides of the gate electrode 107 in the silicon substrate 100 in order to form an amorphous layer 101 with a thickness from the surface of the silicon substrate 100 to a first depth. The thickness of the amorphous layer 101 herein refers to the thickness from the surface of the silicon substrate 100 to the bottom surface of the amorphous layer 101. For example, the amorphous layer 101 becomes shallower under the gate electrode 107. The thickness of the amorphous layer 101 does not refer to the thickness of this shallower portion but refers to the thickness of the remaining portion. Regarding other regions as well, the term "thickness" herein refers to the thickness from the surface of the silicon substrate 101 to the bottom surface of that region. Similarly, the depth of a pn junction refers to the level of the bottom surface of that junction.

By adjusting the ion implantation energy, the first depth is adjusted to a level that is deeper than various pn junctions that are required for transistor formation.

For example, the first depth becomes about 80 nm when germanium is implanted at implantation energy of 60 keV and a dose of $3 \times 10^{14}/cm^2$. This depth is deeper than pn junctions of a drain extension, a halo region and the like that are to be formed later.

As the amorphous layer 101 is formed, defects 103 are generated near the interface between a crystal region of the silicon substrate 100 and the amorphous layer 101 (this interface is present at the first depth).

Figure 2B:
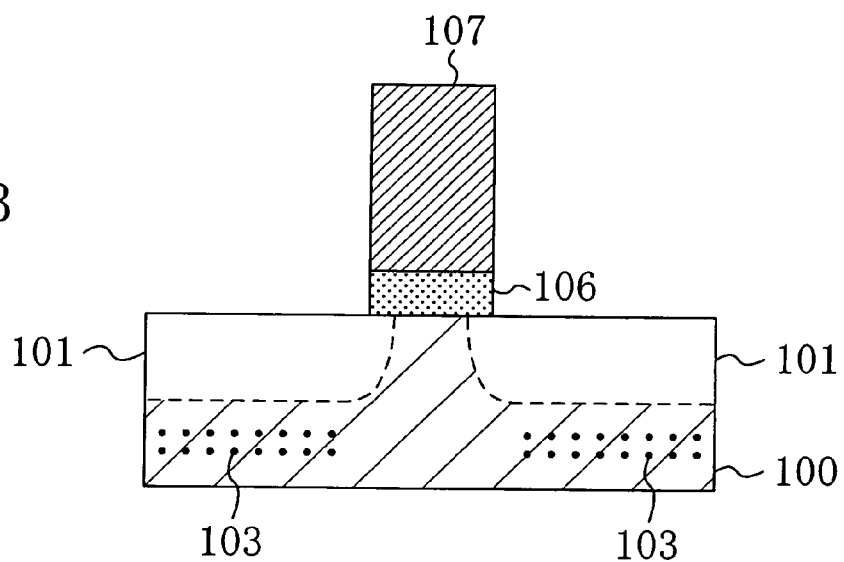
Figure 2C:
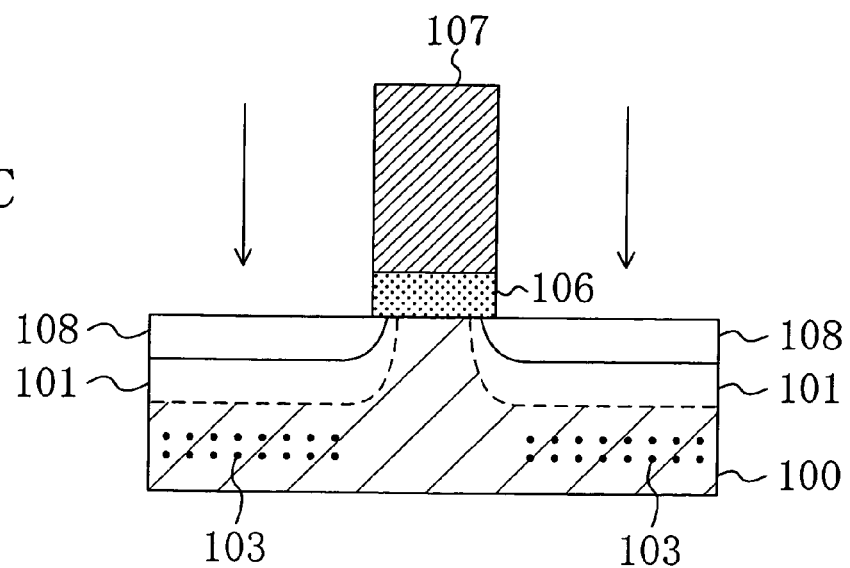

Heat treatment is then conducted for several minutes in the temperature range of 475° C. to 600° C., for example, at 500° C. By this heat treatment, the crystal structure of the amorphous layer 101 can be restored in the region from the first depth to an arbitrary second depth that is shallower than the first depth. The amorphous layer 101 thus shrinks into the region from the surface of the silicon substrate 100 to the second depth. This state is shown in FIG. 2(b). In the present embodiment, the second depth is in the range of 15 nm to 30 nm.

Note that when the crystal structure of the amorphous layer 101 is restored, the defects 103 remain at the same position, that is, near the first depth.

The temperature range of 475° C. to 600° C. that is used in the present invention is preferred, but the invention is not limited to this range.

As shown in FIG. 2(b), impurity ions such as boron are implanted on both sides of the gate electrode 107 in the amorphous layer 101 by using the gate electrode 107 as a mask. As a result, a p-type drain extension 108 extending under a part of the gate electrode 107 is formed as a first impurity layer. For example, the implantation energy is 1 keV or less and the dose is $1 \times 10^{14}/cm^2$. For example, the drain extension 108 has a depth of 5 nm to 15 nm.

Since boron or the like is implanted into the amorphous layer 101, a channeling phenomenon can be suppressed. Therefore, boron is not introduced deep into the silicon substrate 100. The drain extension 108 can thus be formed in a region that is sufficiently shallower than the second depth.

A pn junction is formed at the boundary between the p-type drain extension 108 and the n-type silicon substrate 100. This pn junction is sufficiently separated from the defects that are present at the first depth. Therefore, a junction leakage current resulting from the defects 103 can be suppressed.

Figure 3A:
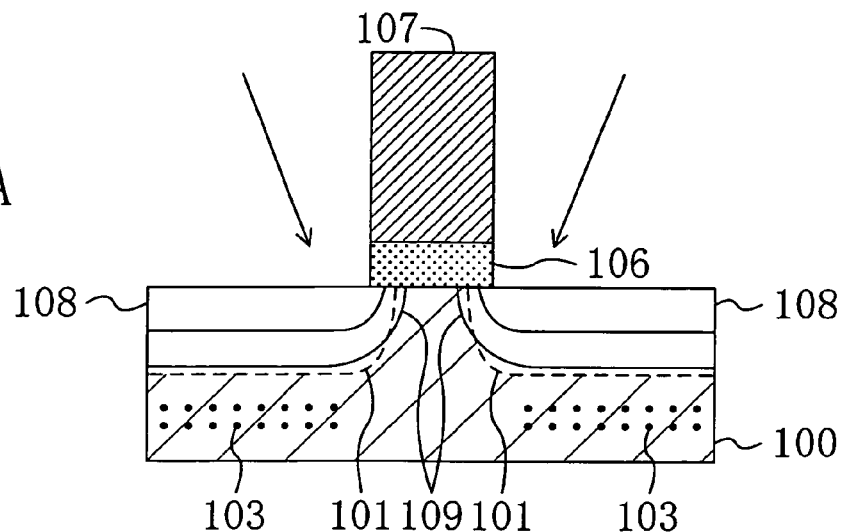
FIGS. 3(a) through 3(c) are schematic cross sectional views showing the steps from halo region formation to impurity layer activation in the method for manufacturing a semiconductor device according to the second embodiment of the invention.

As shown in FIG. 3(a), arsenic ions, for example, are implanted on both sides of the gate electrode 107 in the silicon substrate 100 at a dose of $5 \times 10^{13}/cm^2$ and a tilt angle of 25 degrees with respect to the normal to the substrate surface by using the gate electrode 107 as a mask. As a result, an n-type halo region 109 that surrounds the drain extension 108 and extends more under the gate electrode 107 than the drain extension 108 does is formed as a second impurity layer.

Respective pn junctions of the n-type halo region 109 and the p-type drain extension 108 are sufficiently separated from the defects 103 that are present at the first depth. Therefore, a junction leakage current resulting from the defects 103 can be suppressed.

Figure 3B:
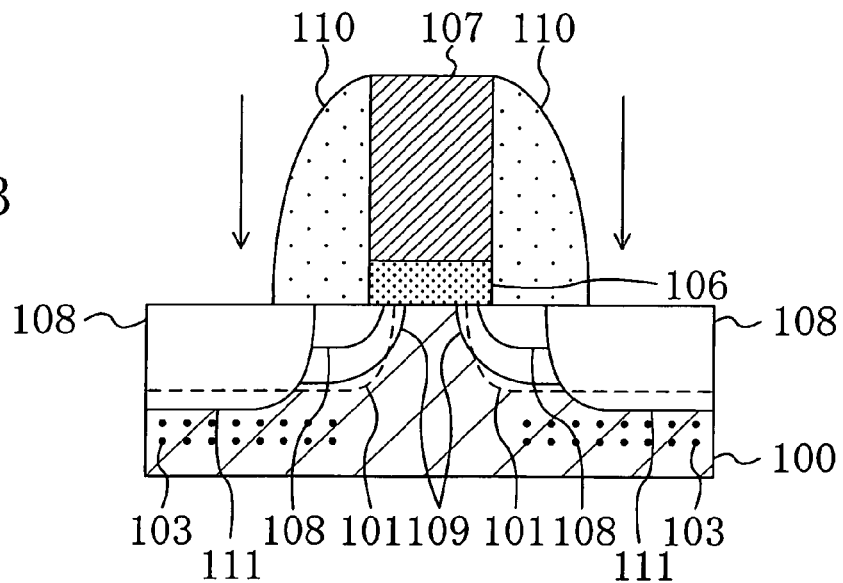

As shown in FIG. 3(b), an insulating sidewall 110 is then formed on both side surfaces of the gate electrode 107. Thereafter, n-type impurity ions are implanted on both sides of the gate electrode 107 and the sidewall 110 in the silicon substrate 100 by using the gate electrode 107 and the sidewall 110 as a mask. A contact drain 111 is thus formed. The contact drain 111 is formed with a higher impurity concentration than that of the drain extension 108 for reduced contact resistance, and with a depth shallower than the first depth (about 80 nm in the present embodiment), e.g., with a depth of about 60 nm.

Impurity layers such as the drain extension 108, the halo region 109, and the contact drain 111 are then activated. This activation process is conducted by using a low temperature SPE technology. More specifically, heat treatment is conducted at a temperature of 500° C. to 800° C. for two to three minutes. The temperature range of 500° C. to 800° C. is preferred, but the invention is not limited to this range. More preferably, the activation process is conducted in the temperature range of 500° C. to 700° C.

Figure 3C:
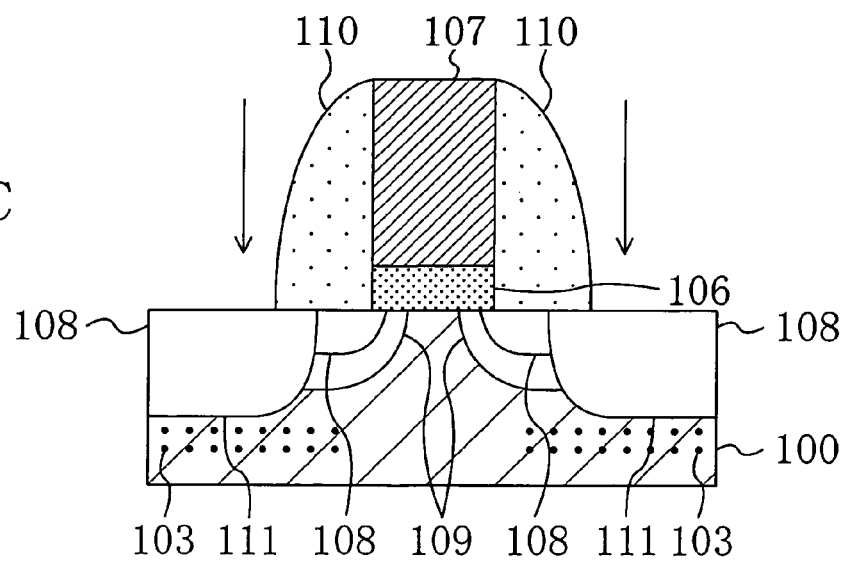

By this activation process, the crystal structure of the amorphous layer 101 is restored and there is no longer an amorphous region in the silicon substrate 100. Moreover, impurity layers such as the drain extension 108, the halo region 109, and the contact drain 111 can be activated without impurity diffusion. This result is shown in FIG. 3(c). Unlike short-time heat treatments such as flash annealing, this heat treatment is conducted for a relatively long treatment time, that is, several minutes. Therefore, even when a pattern formed on the silicon substrate 100 has non-uniformity such as a density difference of the gate electrode 107, transistors can be formed with uniform characteristics without any influence of the non-uniformity.

As has been described above, according to the present embodiment, the amorphous layer 101 is initially formed in the region from the surface of the silicon substrate 100 to the first depth. Thereafter, a part of the crystal structure of the amorphous layer 101 is restored by heat treatment so that the amorphous-crystal interface withdraws to the second depth that is shallower than the first depth. As a result, the defects 103 that are present at the first depth can be separated from the post-heat-treatment amorphous-crystal interface that is located at the second depth. Thereafter, the drain extension 108 and the halo region 109 are formed within the amorphous layer 101 by ion implantation to the amorphous layer 101. Respective pn junctions of the drain extension 108 and the halo region 109 can thus be sufficiently separated from the defects 103.

In this way, a junction leakage current that is generated when a pn junction is close to the defects 103 can be suppressed. By using this effect, pattern dependency can be suppressed by a low temperature SPE technology. Moreover, a semiconductor device can be manufactured with a suppressed junction leakage current by the effects of the invention.

In a dimensionally shrunk transistor having gate dimensions of, e.g., less than about 90 nm, it is preferable to form a halo region 109 as a second impurity layer. However, the halo region 109 is not an essential element in the present embodiment and may be formed as necessary.

In the present embodiment, the first depth is about 80 nm, the second depth is 15 nm to 30 nm, and the depth of the drain extension 108 is 5 nm to 15 nm. These values are preferable. However, the invention is not limited to these values and any values may be used as appropriate.

Ion implantation for forming the amorphous layer 101 and for forming the drain extension 108, the halo region 109, and the contact drain 111 is preferably conducted under the conditions shown in the present embodiment (such as implantation energy, a tilt angle, and a dose). However, the invention is not limited to these conditions. In the present embodiment, ions are introduced into the amorphous layer 101 by ion implantation. However, ions may alternatively be introduced by means other than ion implantation, such as plasma doping.

In the present embodiment, n-type is a first conductivity type and p-type is a second conductivity type. However, p-type may be a first conductivity type and n-type may be a second conductivity type.

In the present embodiment, the amorphous layer 101 is formed after the gate electrode 107 is formed on the silicon substrate 100. Alternatively, however, the amorphous layer 101 and the gate electrode 107 may be formed in the opposite order. In other words, the gate electrode 107 may be formed after the amorphous layer 101 is formed in the silicon substrate 100.

Third Embodiment

Hereinafter, a method for manufacturing a semiconductor device according to a third embodiment of the invention will be described with reference to the accompanying drawings.

FIGS. 4(a) through 4(c) and FIGS. 5(a) through 5(c) are schematic cross-sectional views showing the steps of the method for manufacturing a semiconductor device according to the third embodiment.

Figure 4A:
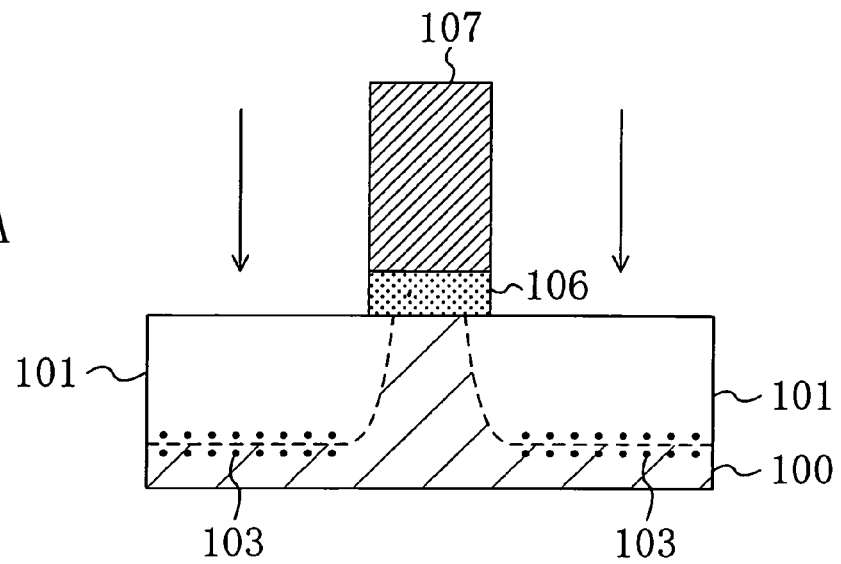
FIGS. 4(a) through 4(c) are schematic cross sectional views showing the steps from gate electrode formation to amorphous layer formation in a method for manufacturing a semiconductor device according to a third embodiment of the invention.

First, as shown in FIG. 4(a), a polysilicon gate electrode 107 is formed on an n-type silicon substrate 100 as a semiconductor region with a gate insulating film 106 interposed therebetween. For example, the gate electrode 107 may be formed by using a known lithography technology and a known etching technology.

Thereafter, ions such as germanium or silicon are implanted on both sides of the gate electrode 107 in the silicon substrate 100 in order to form an amorphous layer 101 having a thickness from the surface of the silicon substrate 100 to a first depth. The thickness of the amorphous layer 100 herein refers to the thickness from the surface of the silicon substrate 100 to the bottom surface of the amorphous layer 101.

By adjusting the ion implantation energy, the first depth is adjusted to a level that is deeper than various pn junctions that are required for transistor formation.

For example, the first depth becomes about 80 nm when germanium is implanted at implantation energy of 60 keV and a dose of $3 \times 10^{14}$/cm$^2$. This depth is deeper than pn junctions of a drain extension, a halo region and the like that are to be formed later.

As the amorphous layer 101 is formed, defects 103 are generated near the interface between a crystal region of the silicon substrate 100 and the amorphous layer 101 (this interface is present at the first depth).

Figure 4B:
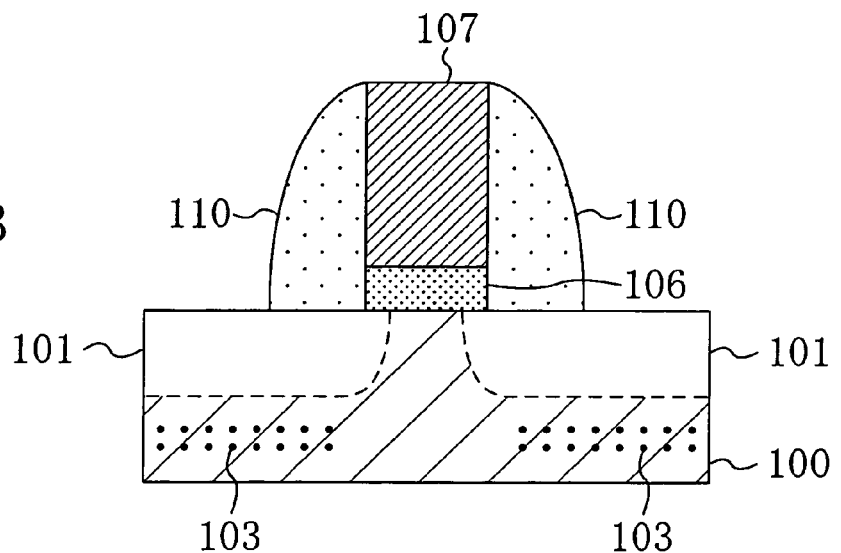

As shown in FIG. 4(b), a silicon oxide film is then deposited on both side surfaces of the gate electrode 107 by low pressure CVD in order to from an insulating sidewall 110. This process involves heat treatment of about 550° C. Therefore, during formation of the sidewall 110, the crystal structure of the amorphous layer 101 is restored in the region from the first depth to an arbitrary second depth that is shallower than the first depth. As a result, the amorphous layer 101 shrinks into the region from the surface of the silicon substrate 100 to the second depth. In the present embodiment, the second depth is in the range of 15 nm to 30 nm.

Note that when the crystal structure of the amorphous layer 101 is restored, the defects 103 remain at the same position, that is, near the first depth.

Figure 4C:
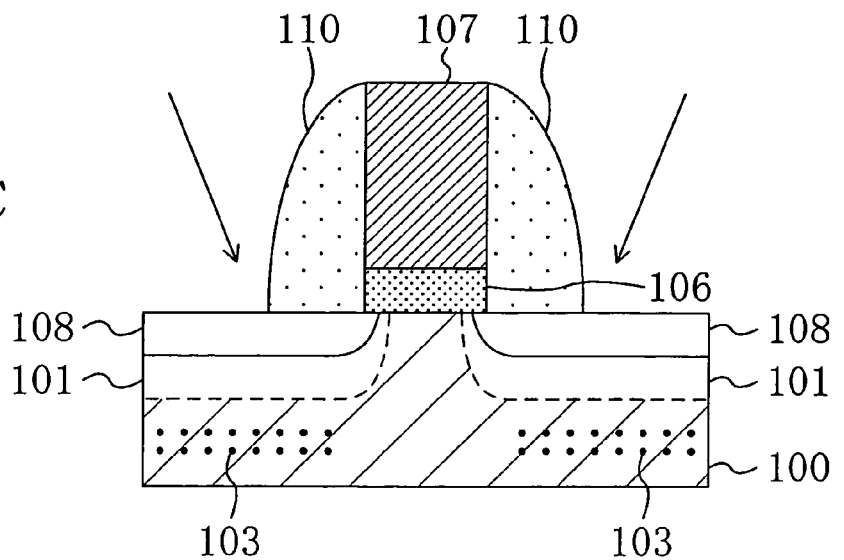

As shown in FIG. 4(c), impurities such as boron are implanted on both sides of the gate electrode 107 and the sidewall 110 in the amorphous layer 101 by using the gate electrode 107 and the sidewall 110 as a mask. As a result, a p-type drain extension 108 extending under a part of the gate electrode 107 is formed as a first impurity layer. For example, this ion implantation is conducted at a tilt angle of 25 degrees with respect to the normal to the substrate surface, implantation energy of 1 keV or less, and a dose of $1\times10^{14}/cm^2$. For example, the drain extension 108 has a depth of 5 nm to 15 nm.

Since boron or the like is implanted into the amorphous layer 101, a channeling phenomenon can be suppressed. Therefore, boron is not introduced deep into the silicon substrate 100. Accordingly, the drain extension 108 can be formed in a region that is sufficiently shallower than the second depth.

A pn junction is thus formed at the boundary between the p-type drain extension 108 and the n-type silicon substrate 100. This pn junction is located at a level that is shallower than the second depth that is shallower than the first depth. Since the pn junction is sufficiently separated from the defects that are present at the first depth, a junction leakage current resulting from the defects 103 can be suppressed.

Figure 5A:
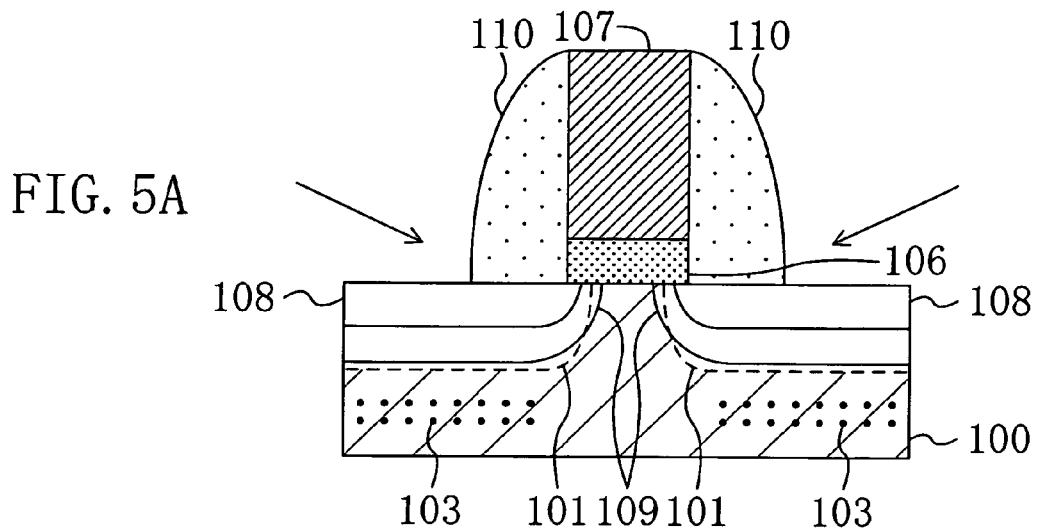
FIGS. 5(a) through 5(c) are schematic cross sectional views showing the steps from halo region formation to impurity layer activation in a method for manufacturing a semiconductor device according to the third embodiment of the invention.

As shown in FIG. 5(a), arsenic ions, for example, are implanted on both sides of the gate electrode 107 and the sidewall 110 in the silicon substrate 100 at a dose of $5\times10^{13}/cm^2$ and a tilt angle of 45 degrees with respect to the normal by using the gate electrode 107 and the sidewall 110 as a mask.

As a result, an n-type halo region 109 that surrounds the drain extension 108 and extends more under the gate electrode 107 than the drain extension 108 does is formed as a second impurity layer. The halo region 109 is formed within the region that is shallower than the second depth.

In this case, respective pn junctions of the n-type halo region 109 and the p-type drain extension 108 are also located at a level that is shallower than the second depth that is shallower than the first depth. Since the pn junctions are sufficiently separated from the defects 103 that are present at the first depth, generation of a junction leakage current resulting from the defects 103 can be prevented.

Figure 5B:
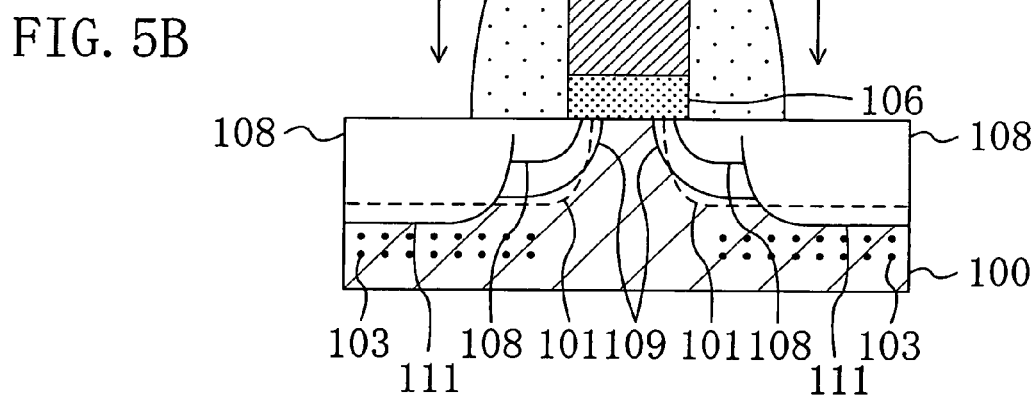

As shown in FIG. 5(b), n-type impurity ions are implanted on both sides of the gate electrode 107 and the sidewall 110 in the silicon substrate 100 by using the gate electrode 107 and the sidewall 110 as a mask. A contact drain 111 is thus formed. The contact drain 111 is formed with a higher impurity concentration than that of the drain extension 108 for reduced contact resistance, and with a depth shallower than the first depth (about 80 nm in the present embodiment), e.g., with a depth of about 60 nm.

Impurity layers such as the drain extension 108, the halo region 109, and the contact drain 111 are then activated. This activation process is conducted by using a low temperature SPE technology. More specifically, heat treatment is conducted at a temperature of 500° C. to 800° C. for two to three minutes. The temperature range of 500° C. to 800° C. is preferred, but the invention is not limited to this range. More preferably, the activation process is conducted in the temperature range of 500° C. to 700° C.

Figure 5C:
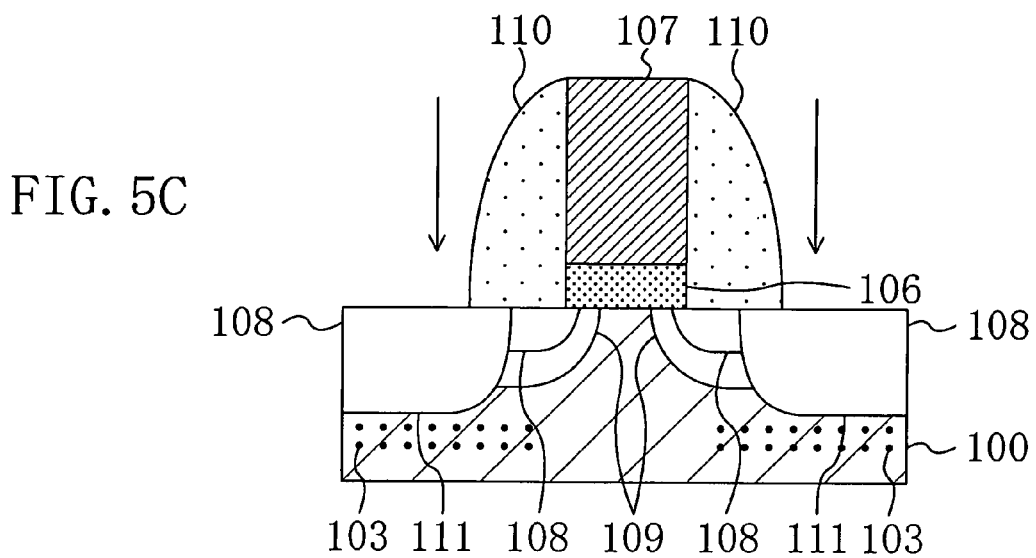
Figure 6A:
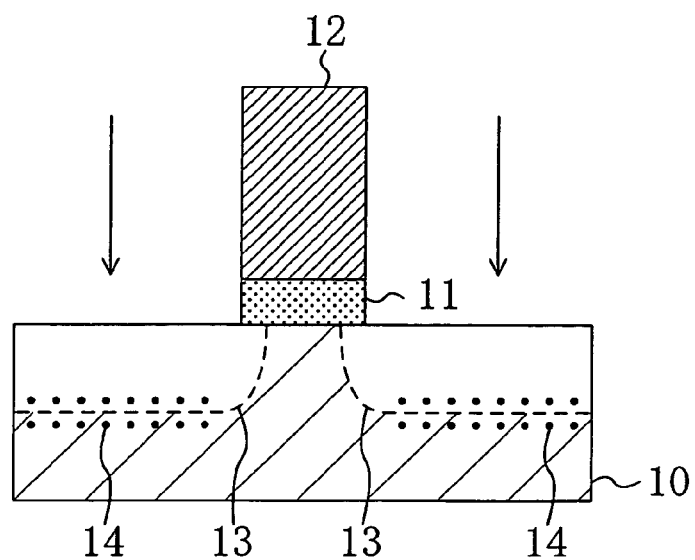
FIGS. 6(a) through 6(c) are schematic cross sectional views showing the steps from gate electrode formation to amorphous layer formation in a conventional method for manufacturing a semiconductor device.
Figure 6B:
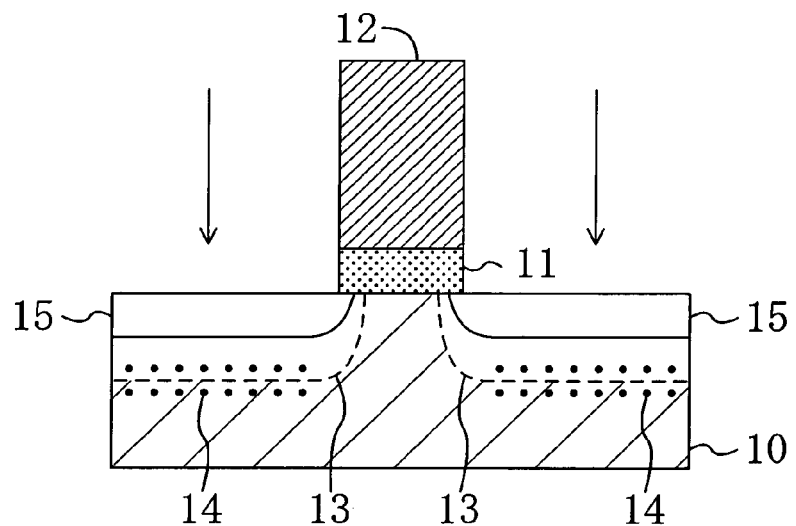
Figure 6C:
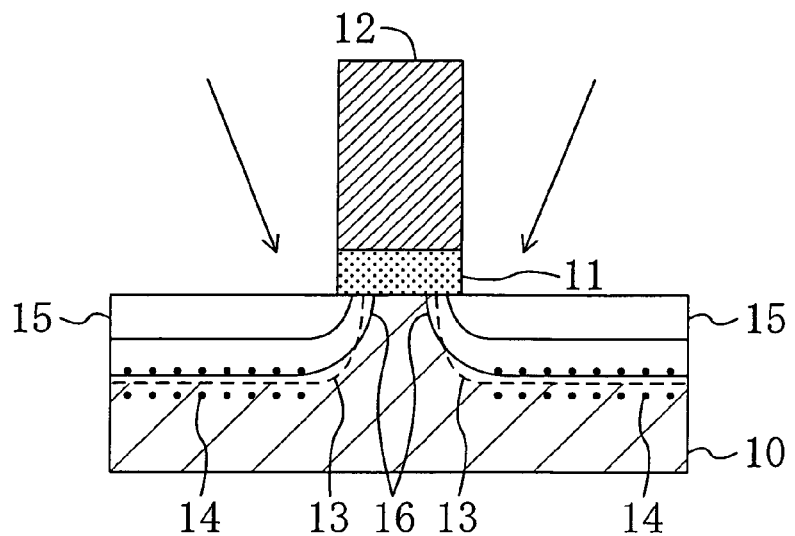
Figure 7A:
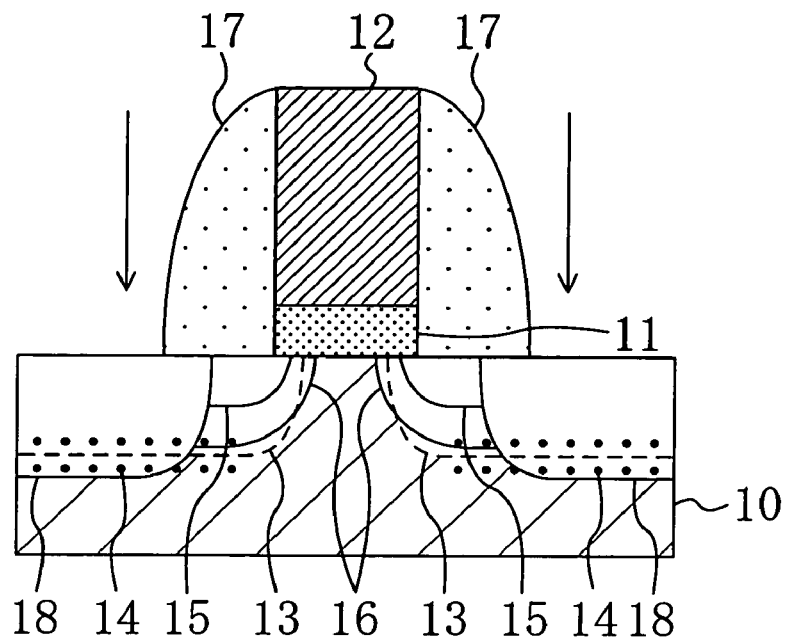
FIGS. 7(a) and 7(b) are schematic cross sectional views showing the steps from contact drain formation to impurity layer activation in the conventional method for manufacturing a semiconductor device.
Figure 7B:
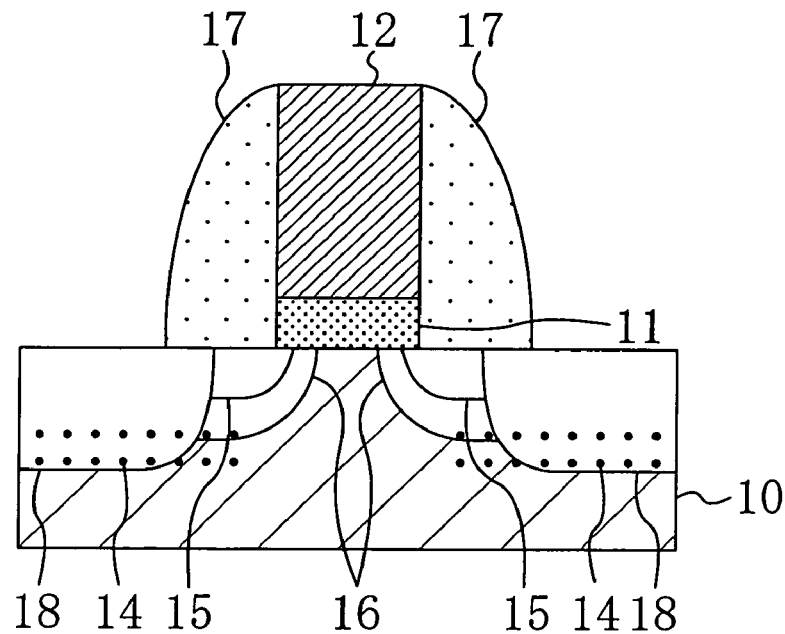
Figure 8:
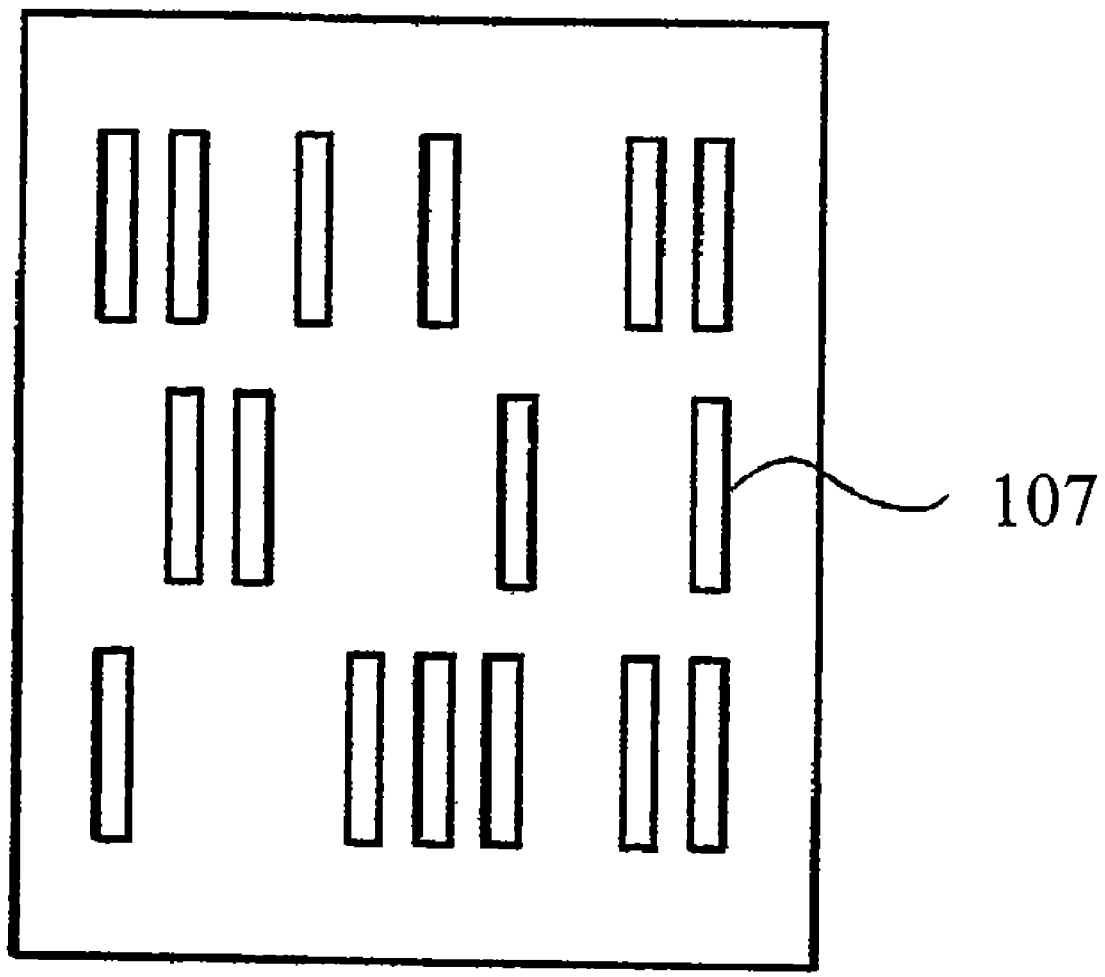
FIG. 8 shows a gate electrode formed on a semiconductor region that is non-uniformly distributed according to an embodiment of the present disclosure.

By this activation process, the crystal structure of the amorphous layer 101 is restored and there is no longer an amorphous region in the silicon substrate 100. Moreover, impurity layers such as the drain extension 108, the halo region 109, and the contact drain 111 can be activated without impurity diffusion. This result is shown in FIG. 5(c). Unlike short-time heat treatments such as flash annealing, this heat treatment is conducted for a relatively long treatment time, that is, several minutes. Therefore, even when a pattern formed on the silicon substrate 100 has non-uniformity such as density difference of the gate electrode 107, transistors can be formed with uniform characteristics without any influence of the non-uniformity.

As has been described above, according to the present embodiment, the amorphous layer 101 is initially formed in the region from the surface of the silicon substrate 100 to the first depth. By the heat treatment that is conducted in the step of forming the sidewall 110, a part of the crystal structure of the amorphous layer 101 is restored so that the amorphous-crystal interface withdraws to the second depth that is shallower than the first depth. As a result, the defects 103 that are present at the first depth can be separated from the post-heat-treatment amorphous-crystal interface that is located at the second depth. The drain extension 108 and the halo region 109 are then formed within the amorphous layer 101 by ion implantation to the amorphous layer 101. Respective pn junctions of the drain extension 108 and the halo region 109 can thus be sufficiently separated from the defects 103.

In this way, a junction leakage current that is generated when a pn junction is close to the defects 103 can be suppressed. By using this effect, pattern dependency can be suppressed by a low temperature SPE technology. Moreover, a semiconductor device can be manufactured with a suppressed junction leakage current by the effects of the invention.

In the present embodiment, the crystal structure of the amorphous layer 101 is restored in the region from the first depth to the second depth by the heat treatment that is conducted in the step of forming the sidewall 110. Therefore, the number of steps can be reduced.

In a dimensionally shrunk transistor having gate dimensions of, e.g., less than about 90 nm, it is preferable to form a halo region 109 as a second impurity layer. However, the halo region 109 is not an essential element in the present embodiment and may be formed as necessary.

Preferable values of the first depth, the second depth, and the depth of the drain extension 108 are shown in the present embodiment. However, the invention is not limited to these values and any values may be used as appropriate.

Ion implantation for forming the amorphous layer 101 and for forming the drain extension 108, the halo region 109, and the contact drain 111 is preferably conducted under the conditions shown in the present embodiment (such as implantation energy, a tilt angle, and a dose). However, the invention is not limited to these conditions.

In the present embodiment, n-type is a first conductivity type and p-type is a second conductivity type. However, p-type may be a first conductivity type and n-type may be a second conductivity type.

In the present embodiment, the amorphous layer 101 is formed after the gate electrode 107 is formed on the silicon substrate 100. Alternatively, however, the amorphous layer 101 and the gate electrode 107 may be formed in the opposite order. In other words, the gate electrode 107 may be formed after the amorphous layer 101 is formed in the silicon substrate 100.

In the present embodiment, ions are introduced into the amorphous layer 101 by ion implantation. However, ions may alternatively be introduced by methods other than ion implantation, such as plasma doping.

INDUSTRIAL AVAILABILITY

A method for manufacturing a semiconductor device according to the invention enables pn junctions of impurity layers to be sufficiently separated from defects that are generated during formation of an amorphous layer. This effect can be utilized to suppress a junction leakage current resulting from the defects. By using a low temperature SPE technology, this effect can also be utilized to form a uniformly shallow drain extension and the like regardless of patterns that are formed on a semiconductor region.

What is claimed is:

1. A method for manufacturing a semiconductor device, comprising the steps of:

forming an amorphous layer in a region from a surface of a semiconductor region of a first conductivity type to a first depth;

by performing a first heat treatment of the amorphous layer at a prescribed temperature, restoring a crystal structure of the amorphous layer in a region from the first depth to a second depth that is shallower than the first depth so that the amorphous layer shrinks to the second depth;

after the first heat treatment, forming a first impurity layer of a second conductivity type which has a pn junction at a third depth that is shallower than the second depth by introducing ions into the amorphous layer extending from the surface of the semiconductor region to the second depth; and performing a second heat treatment of the amorphous layer in a region from the surface of the semiconductor region to the second depth using solid phase epitaxy and restoring a crystal structure of the amorphous layer in a region from the surface of the semiconductor region to the second depth.

2. The manufacturing method of a semiconductor device according to claim 1, wherein the third depth is in a range of 5 nm to 15 nm.

3. The manufacturing method of a semiconductor device according to claim 1, wherein the prescribed temperature is in a range of 475° C. to 600° C.

4. A method for manufacturing a semiconductor device, comprising the steps of:

forming a gate electrode on a semiconductor region of a first conductivity type with a gate insulating film interposed therebetween;

forming an amorphous layer in a region from a surface of the semiconductor region to a first depth;

by performing a first heat treatment of the amorphous layer at a prescribed temperature, restoring a crystal structure of the amorphous layer in a region from the first depth to a second depth that is shallower than the first depth so that the amorphous layer shrinks to the second depth;

after the first heat treatment, forming a first impurity layer of a second conductivity type which has a pn junction at a third depth that is shallower than the second depth by introducing ions into the amorphous layer extending from the surface of the semiconductor region to the second depth;

after the first heat treatment, forming a second impurity layer of a first conductivity type which has a pn junction at a level that is shallower than the first depth and deeper than the third depth by introducing ions into the first heat-treated amorphous layer; and performing a second heat treatment of the amorphous layer in a region from the surface of the semiconductor region to the second depth using solid phase epitaxy and restoring a crystal structure of the amorphous layer in a region from the surface of the semiconductor region to the second depth.

5. The manufacturing method of a semiconductor device according to claim 4, wherein the third depth is in a range of 5 nm to 15 nm.

6. The manufacturing method of a semiconductor device according to claim 4, wherein the prescribed temperature is in a range of 475° C. to 600° C.

7. The manufacturing method of a semiconductor device according to claim 4, wherein a pattern of a gate electrode that is formed on the semiconductor region is non-uniformly distributed on the semiconductor region.

8. A method for manufacturing a semiconductor device, comprising the steps of:

forming a gate electrode on a semiconductor region of a first conductivity type with a gate insulating film interposed therebetween;

forming an amorphous layer in a region from a surface of the semiconductor region to a first depth;

forming an insulating sidewall on a side surface of the gate electrode while restoring a crystal structure of the amorphous layer in a region from the first depth to a second depth that is shallower than the first depth so that the amorphous layer shrinks to the second depth, the restoration of the crystal structure of the amorphous layer being caused by a first heat treatment of a prescribed temperature which is conducted during formation of the sidewall;

after the first heat treatment, forming a first impurity layer of a second conductivity type which has a pn junction at a third depth that is shallower than the second depth by introducing ions on both sides of the gate electrode in the amorphous layer extending from the surface of the semiconductor region to the second depth; and performing a second heat treatment of the amorphous layer in a region from the surface of the semiconductor region to the second depth using solid phase epitaxy and restoring a crystal structure of the amorphous layer in a region from the surface of the semiconductor region to the second depth.

9. The manufacturing method of a semiconductor device according to claim 8, further comprising the step of:

after the step of forming the first impurity layer, forming a second impurity layer of a first conductivity type which has a pn junction at a level that is shallower than the first depth and deeper than the third depth by introducing ions on both sides of the gate electrode in the amorphous layer.

10. The manufacturing method of a semiconductor device according to claim 8, wherein the first impurity layer has a depth of 5 nm to 15 nm.

11. The manufacturing method of a semiconductor device according to claim 8, wherein the prescribed temperature is in a range of 475° C. to 600° C.

12. The manufacturing method of a semiconductor device according to claim 8, wherein a pattern of a gate electrode that is formed on the semiconductor region is non-uniformly distributed on the semiconductor region.

13. The manufacturing method of a semiconductor device according to claim 1, wherein the step of restoring the crystal structure using solid phase epitaxy is conducted by heat treatment in a temperature range of 500° C. to 800° C.

14. The manufacturing method of a semiconductor device according to claim 1, wherein the step of restoring the crystal structure using solid phase epitaxy is conducted by heat treatment in a temperature range of 500° C. to 700° C.

15. The manufacturing method of a semiconductor device according to claim 1, wherein the first impurity layer is activated in the step of restoring the crystal structure using solid phase epitaxy.

16. The manufacturing method of a semiconductor device according to claim 4, wherein the step of restoring the crystal structure using solid phase epitaxy is conducted by heat treatment in a temperature range of 500° C. to 800° C.

17. The manufacturing method of a semiconductor device according to claim 4, wherein the step of restoring the crystal structure using solid phase epitaxy is conducted by heat treatment in a temperature range of 500° C. to 700° C.

18. The manufacturing method of a semiconductor device according to claim 4, wherein the first impurity layer is activated in the step of restoring the crystal structure using solid phase epitaxy.

19. The manufacturing method of a semiconductor device according to claim 8, wherein the step of restoring the crystal structure using solid phase epitaxy is conducted by heat treatment in a temperature range of 500° C. to 800° C.

20. The manufacturing method of a semiconductor device according to claim 8, wherein the first impurity layer is activated in the step of restoring the crystal structure using solid phase epitaxy.

* * * * *

UNITED STATES PATENT AND TRADEMARK OFFICE
CERTIFICATE OF CORRECTION

PATENT NO. : 7,737,012 B2
APPLICATION NO. : 10/557746
DATED : June 15, 2010
INVENTOR(S) : Satoshi Shibata It is certified that error appears in the above-identified patent and that said Letters Patent is hereby corrected as shown below:

ON THE TITLE PAGE:

In Item "(56) References Cited", under "OTHER PUBLICATIONS" and before the Examiner Information, insert the following:

-- BORLAND "Low Temperature Activation of Ion Implanted Dopants: A Review", Japan Society of Applied Physics, 202, pp. 85-88 --

Signed and Sealed this

Twelfth Day of October, 2010

David J. Kappos
*Director of the United States Patent and Trademark Office*